United States Patent
Kowal et al.

(10) Patent No.: US 12,174,272 B2
(45) Date of Patent: *Dec. 24, 2024

(54) TEMPERATURE CONTROL FOR HALL BAR SENSOR CORRECTION

(71) Applicant: Corephotonics Ltd., Tel Aviv (IL)

(72) Inventors: Yiftah Kowal, Tel Aviv (IL); Michael Scherer, Tel Aviv (IL)

(73) Assignee: Corephotonics Ltd., Tel Aviv (IL)

( * ) Notice: Subject to any disclaimer, the term of this patent is extended or adjusted under 35 U.S.C. 154(b) by 0 days.

This patent is subject to a terminal disclaimer.

(21) Appl. No.: 18/320,972

(22) Filed: May 20, 2023

(65) Prior Publication Data

US 2023/0288502 A1    Sep. 14, 2023

Related U.S. Application Data

(63) Continuation of application No. 17/614,571, filed as application No. PCT/IB2021/052802 on Apr. 4, 2021, now Pat. No. 11,693,064.

(Continued)

(51) Int. Cl.
*G01R 33/00* (2006.01)
*G01D 5/14* (2006.01)
(Continued)

(52) U.S. Cl.
CPC ......... *G01R 33/0082* (2013.01); *G01D 5/145* (2013.01); *H02K 11/215* (2016.01);
(Continued)

(58) Field of Classification Search
CPC ............................ G01R 33/0082; G01D 5/145
See application file for complete search history.

(56) References Cited

U.S. PATENT DOCUMENTS

| 3,085,354 A | 4/1963 | Rasmussen et al. |
| 3,584,513 A | 6/1971 | Gates |

(Continued)

FOREIGN PATENT DOCUMENTS

| CN | 101276415 A | 10/2008 |
| CN | 201514511 U | 6/2010 |

(Continued)

OTHER PUBLICATIONS

Statistical Modeling and Performance Characterization of a Real-Time Dual Camera Surveillance System, Greienhagen et al., Publisher: IEEE, 2000, 8 pages.

(Continued)

*Primary Examiner* — Reena Aurora
(74) *Attorney, Agent, or Firm* — Nathan & Associates; Menachem Nathan

(57) ABSTRACT

Systems and methods for eliminating or mitigating T-effects on Hall sensors. A system may comprise a magnet-coil arrangement for providing a relative movement therebetween to obtain a relative position, a Hall sensor for sensing the relative movement, a temperature sensor located in proximity of the Hall sensor for providing temperature sensing, and a controller having two or more channels coupled to Hall sensor and to the temperature sensor and configured to control the relative movement and to provide, based on the temperature sensing, a temperature correction input to the Hall sensor for compensating a temperature effect on the Hall sensor sensing.

19 Claims, 3 Drawing Sheets

Related U.S. Application Data

(60) Provisional application No. 63/015,576, filed on Apr. 26, 2020.

(51) Int. Cl.
*H02K 11/215* (2016.01)
*H02K 41/035* (2006.01)
*H04M 1/02* (2006.01)

(52) U.S. Cl.
CPC ........ *H02K 41/0354* (2013.01); *H04M 1/026* (2013.01); *H04M 2250/12* (2013.01)

(56) References Cited

U.S. PATENT DOCUMENTS

| | | | |
|---|---|---|---|
| 3,941,001 A | 3/1976 | LaSarge | |
| 4,199,785 A | 4/1980 | McCullough et al. | |
| 4,792,822 A | 12/1988 | Akiyama et al. | |
| 5,005,083 A | 4/1991 | Grage et al. | |
| 5,032,917 A | 7/1991 | Aschwanden | |
| 5,041,852 A | 8/1991 | Misawa et al. | |
| 5,051,830 A | 9/1991 | von Hoessle | |
| 5,099,263 A | 3/1992 | Matsumoto et al. | |
| 5,248,971 A | 9/1993 | Mandl | |
| 5,287,093 A | 2/1994 | Amano et al. | |
| 5,331,465 A | 7/1994 | Miyano | |
| 5,394,520 A | 2/1995 | Hall | |
| 5,436,660 A | 7/1995 | Sakamoto | |
| 5,444,478 A | 8/1995 | Lelong et al. | |
| 5,459,520 A | 10/1995 | Sasaki | |
| 5,502,537 A | 3/1996 | Utagawa | |
| 5,657,402 A | 8/1997 | Bender et al. | |
| 5,682,198 A | 10/1997 | Katayama et al. | |
| 5,768,443 A | 6/1998 | Michael et al. | |
| 5,892,855 A | 4/1999 | Kakinami et al. | |
| 5,926,190 A | 7/1999 | Turkowski et al. | |
| 5,940,641 A | 8/1999 | McIntyre et al. | |
| 5,982,951 A | 11/1999 | Katayama et al. | |
| 6,101,334 A | 8/2000 | Fantone | |
| 6,128,416 A | 10/2000 | Oura | |
| 6,148,120 A | 11/2000 | Sussman | |
| 6,201,533 B1 | 3/2001 | Rosenberg et al. | |
| 6,208,765 B1 | 3/2001 | Bergen | |
| 6,211,668 B1 | 4/2001 | Duesler et al. | |
| 6,215,299 B1 | 4/2001 | Reynolds et al. | |
| 6,222,359 B1 | 4/2001 | Duesler et al. | |
| 6,268,611 B1 | 7/2001 | Pettersson et al. | |
| 6,549,215 B2 | 4/2003 | Jouppi | |
| 6,611,289 B1 | 8/2003 | Yu et al. | |
| 6,643,416 B1 | 11/2003 | Daniels et al. | |
| 6,650,368 B1 | 11/2003 | Doron | |
| 6,680,748 B1 | 1/2004 | Monti | |
| 6,714,665 B1 | 3/2004 | Hanna et al. | |
| 6,724,421 B1 | 4/2004 | Glatt | |
| 6,738,073 B2 | 5/2004 | Park et al. | |
| 6,741,250 B1 | 5/2004 | Furlan et al. | |
| 6,750,903 B1 | 6/2004 | Miyatake et al. | |
| 6,778,207 B1 | 8/2004 | Lee et al. | |
| 7,002,583 B2 | 2/2006 | Rabb, III | |
| 7,015,954 B1 | 3/2006 | Foote et al. | |
| 7,038,716 B2 | 5/2006 | Klein et al. | |
| 7,199,348 B2 | 4/2007 | Olsen et al. | |
| 7,206,136 B2 | 4/2007 | Labaziewicz et al. | |
| 7,248,294 B2 | 7/2007 | Slatter | |
| 7,256,944 B2 | 8/2007 | Labaziewicz et al. | |
| 7,305,180 B2 | 12/2007 | Labaziewicz et al. | |
| 7,339,621 B2 | 3/2008 | Fortier | |
| 7,346,217 B1 | 3/2008 | Gold, Jr. | |
| 7,365,793 B2 | 4/2008 | Cheatle et al. | |
| 7,411,610 B2 | 8/2008 | Doyle | |
| 7,424,218 B2 | 9/2008 | Baudisch et al. | |
| 7,509,041 B2 | 3/2009 | Hosono | |
| 7,533,819 B2 | 5/2009 | Barkan et al. | |
| 7,619,683 B2 | 11/2009 | Davis | |
| 7,738,016 B2 | 6/2010 | Toyofuku | |
| 7,773,121 B1 | 8/2010 | Huntsberger et al. | |
| 7,809,256 B2 | 10/2010 | Kuroda et al. | |
| 7,880,776 B2 | 2/2011 | LeGall et al. | |
| 7,918,398 B2 | 4/2011 | Li et al. | |
| 7,964,835 B2 | 6/2011 | Olsen et al. | |
| 7,978,239 B2 | 7/2011 | Deever et al. | |
| 8,115,825 B2 | 2/2012 | Culbert et al. | |
| 8,149,327 B2 | 4/2012 | Lin et al. | |
| 8,154,610 B2 | 4/2012 | Jo et al. | |
| 8,238,695 B1 | 8/2012 | Davey et al. | |
| 8,274,552 B2 | 9/2012 | Dahi et al. | |
| 8,390,729 B2 | 3/2013 | Long et al. | |
| 8,391,697 B2 | 3/2013 | Cho et al. | |
| 8,400,555 B1 | 3/2013 | Georgiev et al. | |
| 8,439,265 B2 | 5/2013 | Ferren et al. | |
| 8,446,484 B2 | 5/2013 | Muukki et al. | |
| 8,483,452 B2 | 7/2013 | Ueda et al. | |
| 8,514,491 B2 | 8/2013 | Duparre | |
| 8,547,389 B2 | 10/2013 | Hoppe et al. | |
| 8,553,106 B2 | 10/2013 | Scarff | |
| 8,587,691 B2 | 11/2013 | Takane | |
| 8,619,148 B1 | 12/2013 | Watts et al. | |
| 8,752,969 B1 | 6/2014 | Kane et al. | |
| 8,803,990 B2 | 8/2014 | Smith | |
| 8,896,655 B2 | 11/2014 | Mauchly et al. | |
| 8,976,255 B2 | 3/2015 | Matsuoto et al. | |
| 9,019,387 B2 | 4/2015 | Nakano | |
| 9,025,073 B2 | 5/2015 | Attar et al. | |
| 9,025,077 B2 | 5/2015 | Attar et al. | |
| 9,041,835 B2 | 5/2015 | Honda | |
| 9,137,447 B2 | 9/2015 | Shibuno | |
| 9,185,291 B1 | 11/2015 | Shabtay et al. | |
| 9,215,377 B2 | 12/2015 | Sokeila et al. | |
| 9,215,385 B2 | 12/2015 | Luo | |
| 9,270,875 B2 | 2/2016 | Brisedoux et al. | |
| 9,286,680 B1 | 3/2016 | Jiang et al. | |
| 9,344,626 B2 | 5/2016 | Silverstein et al. | |
| 9,360,671 B1 | 6/2016 | Zhou | |
| 9,369,621 B2 | 6/2016 | Malone et al. | |
| 9,413,930 B2 | 8/2016 | Geerds | |
| 9,413,984 B2 | 8/2016 | Attar et al. | |
| 9,420,180 B2 | 8/2016 | Jin | |
| 9,438,792 B2 | 9/2016 | Nakada et al. | |
| 9,485,432 B1 | 11/2016 | Medasani et al. | |
| 9,578,257 B2 | 2/2017 | Attar et al. | |
| 9,618,748 B2 | 4/2017 | Munger et al. | |
| 9,681,057 B2 | 6/2017 | Attar et al. | |
| 9,723,220 B2 | 8/2017 | Sugie | |
| 9,736,365 B2 | 8/2017 | Laroia | |
| 9,736,391 B2 | 8/2017 | Du et al. | |
| 9,768,310 B2 | 9/2017 | Ahn et al. | |
| 9,800,798 B2 | 10/2017 | Ravirala et al. | |
| 9,851,803 B2 | 12/2017 | Fisher et al. | |
| 9,894,287 B2 | 2/2018 | Qian et al. | |
| 9,900,522 B2 | 2/2018 | Lu | |
| 9,927,600 B2 | 3/2018 | Goldenberg et al. | |
| 11,693,064 B2 * | 7/2023 | Kowal | G01R 33/0082 324/207.12 |
| 2002/0005902 A1 | 1/2002 | Yuen | |
| 2002/0030163 A1 | 3/2002 | Zhang | |
| 2002/0054214 A1 | 5/2002 | Yoshikawa | |
| 2002/0063711 A1 | 5/2002 | Park et al. | |
| 2002/0075258 A1 | 6/2002 | Park et al. | |
| 2002/0122113 A1 | 9/2002 | Foote | |
| 2002/0167741 A1 | 11/2002 | Koiwai et al. | |
| 2003/0030729 A1 | 2/2003 | Prentice et al. | |
| 2003/0093805 A1 | 5/2003 | Gin | |
| 2003/0156751 A1 | 8/2003 | Lee et al. | |
| 2003/0160886 A1 | 8/2003 | Misawa et al. | |
| 2003/0202113 A1 | 10/2003 | Yoshikawa | |
| 2004/0008773 A1 | 1/2004 | Itokawa | |
| 2004/0012683 A1 | 1/2004 | Yamasaki et al. | |
| 2004/0017386 A1 | 1/2004 | Liu et al. | |
| 2004/0027367 A1 | 2/2004 | Pilu | |
| 2004/0061788 A1 | 4/2004 | Bateman | |
| 2004/0141065 A1 | 7/2004 | Hara et al. | |
| 2004/0141086 A1 | 7/2004 | Mihara | |
| 2004/0239313 A1 | 12/2004 | Godkin | |
| 2004/0240052 A1 | 12/2004 | Minefuji et al. | |

(56) References Cited

U.S. PATENT DOCUMENTS

| | | |
|---|---|---|
| 2005/0013509 A1 | 1/2005 | Samadani |
| 2005/0046740 A1 | 3/2005 | Davis |
| 2005/0134697 A1 | 6/2005 | Mikkonen et al. |
| 2005/0141390 A1 | 6/2005 | Lee et al. |
| 2005/0157184 A1 | 7/2005 | Nakanishi et al. |
| 2005/0168834 A1 | 8/2005 | Matsumoto et al. |
| 2005/0185049 A1 | 8/2005 | Iwai et al. |
| 2005/0200718 A1 | 9/2005 | Lee |
| 2005/0248667 A1 | 11/2005 | Schweng et al. |
| 2006/0054782 A1 | 3/2006 | Olsen et al. |
| 2006/0056056 A1 | 3/2006 | Ahiska et al. |
| 2006/0067672 A1 | 3/2006 | Washisu et al. |
| 2006/0102907 A1 | 5/2006 | Lee et al. |
| 2006/0125937 A1 | 6/2006 | LeGall et al. |
| 2006/0126737 A1 | 6/2006 | Boice et al. |
| 2006/0170793 A1 | 8/2006 | Pasquarette et al. |
| 2006/0175549 A1 | 8/2006 | Miller et al. |
| 2006/0181619 A1 | 8/2006 | Liow et al. |
| 2006/0187310 A1 | 8/2006 | Janson et al. |
| 2006/0187322 A1 | 8/2006 | Janson et al. |
| 2006/0187338 A1 | 8/2006 | May et al. |
| 2006/0227236 A1 | 10/2006 | Pak |
| 2007/0024737 A1 | 2/2007 | Nakamura et al. |
| 2007/0126911 A1 | 6/2007 | Nanjo |
| 2007/0127040 A1 | 6/2007 | Davidovici |
| 2007/0159344 A1 | 7/2007 | Kisacanin |
| 2007/0177025 A1 | 8/2007 | Kopet et al. |
| 2007/0188653 A1 | 8/2007 | Pollock et al. |
| 2007/0189386 A1 | 8/2007 | Imagawa et al. |
| 2007/0257184 A1 | 11/2007 | Olsen et al. |
| 2007/0285550 A1 | 12/2007 | Son |
| 2008/0017557 A1 | 1/2008 | Witdouck |
| 2008/0024614 A1 | 1/2008 | Li et al. |
| 2008/0025634 A1 | 1/2008 | Border et al. |
| 2008/0030592 A1 | 2/2008 | Border et al. |
| 2008/0030611 A1 | 2/2008 | Jenkins |
| 2008/0084484 A1 | 4/2008 | Ochi et al. |
| 2008/0088942 A1 | 4/2008 | Seo |
| 2008/0106629 A1 | 5/2008 | Kurtz et al. |
| 2008/0117316 A1 | 5/2008 | Orimoto |
| 2008/0129831 A1 | 6/2008 | Cho et al. |
| 2008/0218611 A1 | 9/2008 | Parulski et al. |
| 2008/0218612 A1 | 9/2008 | Border et al. |
| 2008/0218613 A1 | 9/2008 | Janson et al. |
| 2008/0219654 A1 | 9/2008 | Border et al. |
| 2009/0086074 A1 | 4/2009 | Li et al. |
| 2009/0102948 A1 | 4/2009 | Scherling |
| 2009/0109556 A1 | 4/2009 | Shimizu et al. |
| 2009/0122195 A1 | 5/2009 | Van Baar et al. |
| 2009/0122406 A1 | 5/2009 | Rouvinen et al. |
| 2009/0128644 A1 | 5/2009 | Camp et al. |
| 2009/0168135 A1 | 7/2009 | Yu et al. |
| 2009/0200451 A1 | 8/2009 | Conners |
| 2009/0219547 A1 | 9/2009 | Kauhanen et al. |
| 2009/0234542 A1 | 9/2009 | Orlewski |
| 2009/0252484 A1 | 10/2009 | Hasuda et al. |
| 2009/0295949 A1 | 12/2009 | Ojala |
| 2009/0324135 A1 | 12/2009 | Kondo et al. |
| 2010/0013906 A1 | 1/2010 | Border et al. |
| 2010/0020221 A1 | 1/2010 | Tupman et al. |
| 2010/0060746 A9 | 3/2010 | Olsen et al. |
| 2010/0097444 A1 | 4/2010 | Lablans |
| 2010/0103194 A1 | 4/2010 | Chen et al. |
| 2010/0134621 A1 | 6/2010 | Namkoong et al. |
| 2010/0165131 A1 | 7/2010 | Makimoto et al. |
| 2010/0196001 A1 | 8/2010 | Ryynänen et al. |
| 2010/0202068 A1 | 8/2010 | Ito |
| 2010/0238327 A1 | 9/2010 | Griffith et al. |
| 2010/0246024 A1 | 9/2010 | Aoki et al. |
| 2010/0259836 A1 | 10/2010 | Kang et al. |
| 2010/0265331 A1 | 10/2010 | Tanaka |
| 2010/0283842 A1 | 11/2010 | Guissin et al. |
| 2010/0321494 A1 | 12/2010 | Peterson et al. |
| 2011/0058320 A1 | 3/2011 | Kim et al. |
| 2011/0063417 A1 | 3/2011 | Peters et al. |
| 2011/0063446 A1 | 3/2011 | McMordie et al. |
| 2011/0064327 A1 | 3/2011 | Dagher et al. |
| 2011/0080487 A1 | 4/2011 | Venkataraman et al. |
| 2011/0121666 A1 | 5/2011 | Park et al. |
| 2011/0128288 A1 | 6/2011 | Petrou et al. |
| 2011/0164172 A1 | 7/2011 | Shintani et al. |
| 2011/0221599 A1 | 9/2011 | Högasten |
| 2011/0229054 A1 | 9/2011 | Weston et al. |
| 2011/0234798 A1 | 9/2011 | Chou |
| 2011/0234853 A1 | 9/2011 | Hayashi et al. |
| 2011/0234881 A1 | 9/2011 | WNakabayashi et al. |
| 2011/0242286 A1 | 10/2011 | Pace et al. |
| 2011/0242355 A1 | 10/2011 | Goma et al. |
| 2011/0285714 A1 | 11/2011 | Swic et al. |
| 2011/0298966 A1 | 12/2011 | Kirschstein et al. |
| 2012/0014682 A1 | 1/2012 | David et al. |
| 2012/0026366 A1 | 2/2012 | Golan et al. |
| 2012/0044372 A1 | 2/2012 | Cote et al. |
| 2012/0062780 A1 | 3/2012 | Morihisa |
| 2012/0069235 A1 | 3/2012 | Imai |
| 2012/0075489 A1 | 3/2012 | Nishihara |
| 2012/0105579 A1 | 5/2012 | Jeon et al. |
| 2012/0124525 A1 | 5/2012 | Kang |
| 2012/0154547 A1 | 6/2012 | Aizawa |
| 2012/0154614 A1 | 6/2012 | Moriya et al. |
| 2012/0196648 A1 | 8/2012 | Havens et al. |
| 2012/0229663 A1 | 9/2012 | Nelson et al. |
| 2012/0249815 A1 | 10/2012 | Bohn et al. |
| 2012/0287315 A1 | 11/2012 | Huang et al. |
| 2012/0320467 A1 | 12/2012 | Baik et al. |
| 2013/0002928 A1 | 1/2013 | Imai |
| 2013/0016427 A1 | 1/2013 | Sugawara |
| 2013/0063629 A1 | 3/2013 | Webster et al. |
| 2013/0076922 A1 | 3/2013 | Shihoh et al. |
| 2013/0093842 A1 | 4/2013 | Yahata |
| 2013/0094126 A1 | 4/2013 | Rappoport et al. |
| 2013/0113894 A1 | 5/2013 | Mirlay |
| 2013/0135445 A1 | 5/2013 | Dahi et al. |
| 2013/0148215 A1 | 6/2013 | Mori et al. |
| 2013/0148854 A1 | 6/2013 | Wang et al. |
| 2013/0155176 A1 | 6/2013 | Paripally et al. |
| 2013/0163085 A1 | 6/2013 | Lim et al. |
| 2013/0182150 A1 | 7/2013 | Asakura |
| 2013/0201360 A1 | 8/2013 | Song |
| 2013/0202273 A1 | 8/2013 | Ouedraogo et al. |
| 2013/0229544 A1 | 9/2013 | Bando |
| 2013/0235224 A1 | 9/2013 | Park et al. |
| 2013/0250150 A1 | 9/2013 | Malone et al. |
| 2013/0258044 A1 | 10/2013 | Betts-Lacroix |
| 2013/0258048 A1 | 10/2013 | Wang et al. |
| 2013/0270419 A1 | 10/2013 | Singh et al. |
| 2013/0278785 A1 | 10/2013 | Nomura et al. |
| 2013/0286221 A1 | 10/2013 | Shechtman et al. |
| 2013/0321668 A1 | 12/2013 | Kamath |
| 2014/0009631 A1 | 1/2014 | Topliss |
| 2014/0049615 A1 | 2/2014 | Uwagawa |
| 2014/0118584 A1 | 5/2014 | Lee et al. |
| 2014/0160311 A1 | 6/2014 | Hwang et al. |
| 2014/0192224 A1 | 7/2014 | Laroia |
| 2014/0192238 A1 | 7/2014 | Attar et al. |
| 2014/0192253 A1 | 7/2014 | Laroia |
| 2014/0218587 A1 | 8/2014 | Shah |
| 2014/0313316 A1 | 10/2014 | Olsson et al. |
| 2014/0362242 A1 | 12/2014 | Takizawa |
| 2014/0376090 A1 | 12/2014 | Terajima |
| 2014/0379103 A1 | 12/2014 | Ishikawa et al. |
| 2015/0002683 A1 | 1/2015 | Hu et al. |
| 2015/0002684 A1 | 1/2015 | Kuchiki |
| 2015/0042870 A1 | 2/2015 | Chan et al. |
| 2015/0070781 A1 | 3/2015 | Cheng et al. |
| 2015/0092066 A1 | 4/2015 | Geiss et al. |
| 2015/0103147 A1 | 4/2015 | Ho et al. |
| 2015/0110345 A1 | 4/2015 | Weichselbaum |
| 2015/0124059 A1 | 5/2015 | Georgiev et al. |
| 2015/0138381 A1 | 5/2015 | Ahn |
| 2015/0145965 A1 | 5/2015 | Livyatan et al. |
| 2015/0154776 A1 | 6/2015 | Zhang et al. |
| 2015/0162048 A1 | 6/2015 | Hirata et al. |
| 2015/0195458 A1 | 7/2015 | Nakayama et al. |

(56) References Cited

U.S. PATENT DOCUMENTS

| | | |
|---|---|---|
| 2015/0198464 A1 | 7/2015 | El Alami |
| 2015/0215516 A1 | 7/2015 | Dolgin |
| 2015/0237280 A1 | 8/2015 | Choi et al. |
| 2015/0242994 A1 | 8/2015 | Shen |
| 2015/0244906 A1 | 8/2015 | Wu et al. |
| 2015/0253543 A1 | 9/2015 | Mercado |
| 2015/0253647 A1 | 9/2015 | Mercado |
| 2015/0261299 A1 | 9/2015 | Wajs |
| 2015/0271471 A1 | 9/2015 | Hsieh et al. |
| 2015/0281678 A1 | 10/2015 | Park et al. |
| 2015/0286033 A1 | 10/2015 | Osborne |
| 2015/0296112 A1 | 10/2015 | Park et al. |
| 2015/0316744 A1 | 11/2015 | Chen |
| 2015/0334309 A1 | 11/2015 | Peng et al. |
| 2016/0044250 A1 | 2/2016 | Shabtay et al. |
| 2016/0070088 A1 | 3/2016 | Koguchi |
| 2016/0154066 A1 | 6/2016 | Hioka et al. |
| 2016/0154202 A1 | 6/2016 | Wippermann et al. |
| 2016/0154204 A1 | 6/2016 | Lim et al. |
| 2016/0212358 A1 | 7/2016 | Shikata |
| 2016/0212418 A1 | 7/2016 | Demirdjian et al. |
| 2016/0238834 A1 | 8/2016 | Erlich et al. |
| 2016/0241751 A1 | 8/2016 | Park |
| 2016/0291295 A1 | 10/2016 | Shabtay et al. |
| 2016/0295112 A1 | 10/2016 | Georgiev et al. |
| 2016/0301840 A1 | 10/2016 | Du et al. |
| 2016/0301868 A1 | 10/2016 | Acharya et al. |
| 2016/0342095 A1 | 11/2016 | Bieling et al. |
| 2016/0353008 A1 | 12/2016 | Osborne |
| 2016/0353012 A1 | 12/2016 | Kao et al. |
| 2016/0381289 A1 | 12/2016 | Kim et al. |
| 2017/0001577 A1 | 1/2017 | Seagraves et al. |
| 2017/0019616 A1 | 1/2017 | Zhu et al. |
| 2017/0070731 A1 | 3/2017 | Darling et al. |
| 2017/0094187 A1 | 3/2017 | Sharma et al. |
| 2017/0115466 A1* | 4/2017 | Murakami ............... G03B 5/00 |
| 2017/0124987 A1 | 5/2017 | Kim et al. |
| 2017/0150061 A1 | 5/2017 | Shabtay et al. |
| 2017/0187962 A1 | 6/2017 | Lee et al. |
| 2017/0214846 A1 | 7/2017 | Du et al. |
| 2017/0214866 A1 | 7/2017 | Zhu et al. |
| 2017/0219749 A1 | 8/2017 | Hou et al. |
| 2017/0242225 A1 | 8/2017 | Fiske |
| 2017/0276954 A1 | 9/2017 | Bajorins et al. |
| 2017/0289458 A1 | 10/2017 | Song et al. |
| 2018/0013944 A1 | 1/2018 | Evans, V et al. |
| 2018/0017844 A1 | 1/2018 | Yu et al. |
| 2018/0024329 A1 | 1/2018 | Goldenberg et al. |
| 2018/0059379 A1 | 3/2018 | Chou |
| 2018/0109660 A1 | 4/2018 | Yoon et al. |
| 2018/0109710 A1 | 4/2018 | Lee et al. |
| 2018/0120674 A1 | 5/2018 | Avivi et al. |
| 2018/0150973 A1 | 5/2018 | Tang et al. |
| 2018/0176426 A1 | 6/2018 | Wei et al. |
| 2018/0184010 A1 | 6/2018 | Cohen et al. |
| 2018/0198897 A1 | 7/2018 | Tang et al. |
| 2018/0241922 A1 | 8/2018 | Baldwin et al. |
| 2018/0295292 A1 | 10/2018 | Lee et al. |
| 2018/0300901 A1 | 10/2018 | Wakai et al. |
| 2018/0329281 A1 | 11/2018 | Ye |
| 2018/0368656 A1 | 12/2018 | Austin et al. |
| 2019/0100156 A1 | 4/2019 | Chung et al. |
| 2019/0121103 A1 | 4/2019 | Bachar et al. |
| 2019/0121216 A1 | 4/2019 | Shabtay et al. |
| 2019/0130822 A1 | 5/2019 | Jung et al. |
| 2019/0213712 A1 | 7/2019 | Lashdan et al. |
| 2019/0215440 A1 | 7/2019 | Rivard et al. |
| 2019/0222758 A1 | 7/2019 | Goldenberg et al. |
| 2019/0228562 A1 | 7/2019 | Song |
| 2019/0297238 A1 | 9/2019 | Klosterman |
| 2020/0103726 A1 | 4/2020 | Shabtay et al. |
| 2020/0104034 A1 | 4/2020 | Lee et al. |
| 2020/0134848 A1 | 4/2020 | El-Khamy et al. |
| 2020/0221026 A1 | 7/2020 | Fridman et al. |
| 2020/0264403 A1 | 8/2020 | Bachar et al. |
| 2020/0389580 A1 | 12/2020 | Kodama et al. |
| 2021/0180989 A1 | 6/2021 | Fukumura et al. |
| 2021/0333521 A9 | 10/2021 | Yedid et al. |
| 2022/0252963 A1 | 8/2022 | Shabtay et al. |

FOREIGN PATENT DOCUMENTS

| | | |
|---|---|---|
| CN | 102215373 A | 10/2011 |
| CN | 102739949 A | 10/2012 |
| CN | 102982518 A | 3/2013 |
| CN | 103024272 A | 4/2013 |
| CN | 203406908 U | 1/2014 |
| CN | 203482298 U | 3/2014 |
| CN | 103841404 A | 6/2014 |
| CN | 205301703 U | 6/2016 |
| CN | 105827903 A | 8/2016 |
| CN | 105847662 A | 8/2016 |
| CN | 107608052 A | 1/2018 |
| CN | 107682489 A | 2/2018 |
| CN | 109729266 A | 5/2019 |
| EP | 1536633 A1 | 6/2005 |
| EP | 1780567 A1 | 5/2007 |
| EP | 2523450 A1 | 11/2012 |
| JP | S59191146 A | 10/1984 |
| JP | 04211230 A | 8/1992 |
| JP | H07318864 A | 12/1995 |
| JP | 08271976 A | 10/1996 |
| JP | 2002010276 A | 1/2002 |
| JP | 2003298920 A | 10/2003 |
| JP | 2003304024 A | 10/2003 |
| JP | 2004056779 A | 2/2004 |
| JP | 2004133054 A | 4/2004 |
| JP | 2004245982 A | 9/2004 |
| JP | 2005099265 A | 4/2005 |
| JP | 2005122084 A | 5/2005 |
| JP | 2005321592 A | 11/2005 |
| JP | 2006237914 A | 9/2006 |
| JP | 2006238325 A | 9/2006 |
| JP | 2007086808 A | 4/2007 |
| JP | 2007228006 A | 9/2007 |
| JP | 2007306282 A | 11/2007 |
| JP | 2008076485 A | 4/2008 |
| JP | 2008271026 A | 11/2008 |
| JP | 2010204341 A | 9/2010 |
| JP | 2011055246 A | 3/2011 |
| JP | 2011085666 A | 4/2011 |
| JP | 2011138407 A | 7/2011 |
| JP | 2011203283 A | 10/2011 |
| JP | 2012132739 A | 7/2012 |
| JP | 2013101213 A | 5/2013 |
| JP | 2013106289 A | 5/2013 |
| JP | 2016105577 A | 6/2016 |
| JP | 2017146440 A | 8/2017 |
| KR | 20070005946 A | 1/2007 |
| KR | 20090058229 A | 6/2009 |
| KR | 20100008936 A | 1/2010 |
| KR | 20110080590 A | 7/2011 |
| KR | 20130104764 A | 9/2013 |
| KR | 1020130135805 A | 11/2013 |
| KR | 20140014787 A | 2/2014 |
| KR | 101428042 B1 | 8/2014 |
| KR | 101477178 B1 | 12/2014 |
| KR | 20140144126 A | 12/2014 |
| KR | 20150118012 A | 10/2015 |
| KR | 20170105236 A | 9/2017 |
| KR | 20180120894 A | 11/2018 |
| KR | 20130085116 A | 6/2019 |
| WO | 2000027131 A2 | 5/2000 |
| WO | 2004084542 A1 | 9/2004 |
| WO | 2006008805 A1 | 1/2006 |
| WO | 2010122841 A1 | 10/2010 |
| WO | 2014072818 A2 | 5/2014 |
| WO | 2017025822 A1 | 2/2017 |

(56) References Cited

FOREIGN PATENT DOCUMENTS

| WO | 2017037688 A1 | 3/2017 |
|---|---|---|
| WO | 2018130898 A1 | 7/2018 |

OTHER PUBLICATIONS

A 3MPixel Multi-Aperture Image Sensor with 0.7μm Pixels in 0.11μm CMOS, Fife et al., Stanford University, 2008, 3 pages.

Dual camera intelligent sensor for high definition 360 degrees surveillance, Scotti et al., Publisher: IET, May 9, 2000, 8 pages.

Dual-sensor foveated imaging system, Hua et al., Publisher: Optical Society of America, Jan. 14, 2008, 11 pages.

Defocus Video Matting, McGuire et al., Publisher: ACM SIGGRAPH, Jul. 31, 2005, 11 pages.

Compact multi-aperture imaging with high angular resolution, Santacana et al., Publisher: Optical Society of America, 2015, 10 pages.

Multi-Aperture Photography, Green et al., Publisher: Mitsubishi Electric Research Laboratories, Inc., Jul. 2007, 10 pages.

Multispectral Bilateral Video Fusion, Bennett et al., Publisher: IEEE, May 2007, 10 pages.

Super-resolution imaging using a camera array, Santacana et al., Publisher: Optical Society of America, 2014, 6 pages.

Optical Splitting Trees for High-Precision Monocular Imaging, McGuire et al., Publisher: IEEE, 2007, 11 pages.

High Performance Imaging Using Large Camera Arrays, Wilburn et al., Publisher: Association for Computing Machinery, Inc., 2005, 12 pages.

Real-time Edge-Aware Image Processing with the Bilateral Grid, Chen et al., Publisher: ACM SIGGRAPH, 2007, 9 pages.

Superimposed multi-resolution imaging, Carles et al., Publisher: Optical Society of America, 2017, 13 pages.

Viewfinder Alignment, Adams et al., Publisher: Eurographics, 2008, 10 pages.

Dual-Camera System for Multi-Level Activity Recognition, Bodor et al., Publisher: IEEE, Oct. 2014, 6 pages.

Engineered to the task: Why camera-phone cameras are different, Giles Humpston, Publisher: Solid State Technology, Jun. 2009, 3 pages.

Office Action in related EP patent application 21795370.2, dated Oct. 13, 2023.

ESR in related EP patent application 21795370.2, dated Oct. 2, 2023.

* cited by examiner

TEMPERATURE CONTROL FOR HALL BAR SENSOR CORRECTION

CROSS REFERENCE TO RELATED APPLICATIONS

This application is a continuation application of U.S. patent application Ser. No. 17/614,571 filed Nov. 29, 2021, which is a 371 application from international patent application PCT/IB2021/052802 filed Apr. 4, 2021, and claims the benefit of U.S. Provisional patent application No. 63/015,576 filed Apr. 26, 2020, which is incorporated herein by reference in its entirety.

FIELD

Embodiments disclosed herein relate to voice coil motors (VCMs) in small portable electronic devices such as smartphones, tablet computers, laptops etc. and in particular to compensation for the impact of heat (temperature) on sensors measuring movement actuated by such VCMs.

BACKGROUND

Cameras incorporated in various mobile electronic devices such as smartphones, tablet computers, laptops etc. use miniature, compact actuators for various movements (e.g. rotating, tilting, shifting, etc.) of various elements such as lenses, reflecting elements and others. These actuators are often of a voice coil motor (VCM) or a stepper motor. In particular, VCMs are used for moving lenses for focusing and for moving reflecting elements (in "folded" cameras) and/or lenses for optical image stabilization (OIS). A VCM includes at least one magnet-coil pair. FIG. 1 shows schematically an exemplary VCM numbered 100, comprising a magnet 102, a coil 104 and a Hall bar sensor (or simply "Hall sensor" or "Hall bar") 106 in (a) top (planar) view and (b) a side (cross section) view. During actuation, controlled through a controller (not shown here), the magnet and coil perform a relative movement therebetween (e.g. in the X direction in the XY plane shown), the movement driven by current passing through the coil. The position of the magnet relative to the coil is measured by the Hall sensor and read by the controller. In some embodiments, the Hall sensor is located within the coil, as in FIG. 1.

The measurement by the Hall sensor is affected by temperature ("T") changes. Increases in T are caused by the current driven through the coil as well as by heat generated by various components of the camera and/or around the VCM. In a VCM such as 100, a typical T increase at a location within the coil such as the location of Hall sensor 106 may be 10-75 degrees or more. For typical Hall sensors, a T increase of 100 degrees may lead to a decrease in output voltage of 3-10%.

For example, assuming (1) a T increase of 50 degrees, (2) a Hall sensor undergoing an output voltage decrease of 6% for 100 degrees, and (3) a linear behavior of this decrease over the 100 degree range, an output voltage decrease of 3% may be expected. This 3% decrease can pose a significant obstacle for applications such as OIS or autofocusing (AF) a camera, where typically accuracies of a few micrometers (μm) are required for a travel range or "stroke" of 0.3-1 mm.

The T-effect on a Hall sensor position measurement is an unwanted, deleterious effect, affecting in particular the repeatability of the Hall sensor output with respect to magnetic flux. The accuracy in positioning of camera components (such as lenses) actuated by VCMs can be improved if the T-effect on the Hall sensor position measurement is eliminated or at least mitigated.

There is a need for, and it would be advantageous to have elimination or at least mitigation of the T-effect on a Hall sensor in a VCM.

SUMMARY

In various embodiments, there are provided systems for eliminating or mitigating T-effects on Hall sensors in VCMs, in which a very small temperature sensor (semiconductor diode) that can fit next to a Hall sensor inside the coil and which is coupled electrically to available, unused Hall sensor channels of the MCU that controls the VCM.

In some embodiments, a system may comprise a magnet-coil arrangement for providing a relative movement therebetween to obtain a relative position; a Hall sensor for sensing the relative movement; a temperature sensor located in proximity of the Hall sensor for providing temperature sensing; and a controller having two or more channels coupled to Hall sensor and to the temperature sensor and configured to control the relative movement and to provide, based on the temperature sensing, a temperature correction input to the Hall sensor for compensating (correcting) a temperature effect on the Hall sensor sensing, whereby the corrected Hall sensor sensing can be used to correct the relative position.

In some embodiments, the magnet-coil arrangement may be included in a voice coil-motor. In some embodiments, the magnet-coil arrangement may be included in a stepper motor.

In some embodiments, the controller may be coupled to the temperature sensor through existing unused controller channels. In some embodiments, the Hall sensor may be located within the coil. In some embodiments, both the temperature sensor and the Hall sensor are located within the coil. In some embodiments, the temperature sensor may be a semiconductor diode. In some embodiments, the temperature sensor may be a thermistor.

In some embodiments, the controller may have two channels. In some embodiments, the controller may have three channels. In some embodiments, the controller may have four or more channels.

In some embodiments, the Hall sensor includes a Hall sensor input and a Hall sensor output and the controller includes an interface for operative coupling to the Hall sensor input and output.

In some embodiments, the controller channels interface includes a first Hall sensor channel comprising a first current module coupled to the Hall sensor input and a first voltage sense module coupled to the Hall sensor output and sensing the Hall output voltage, and a second Hall sensor channel comprising a second current module coupled to the temperature sensor and a second voltage sense module coupled to the temperature sensor and sensing the temperature sensor output voltage that is correlated with the temperature.

In some embodiments, the controller may have an area smaller than 25 mm². In some embodiments, the controller may have an area smaller than 20 mm². In some embodiments, the controller may have an area smaller than 15 mm².

In some embodiments, the Hall sensor and the temperature sensor are thermally coupled. In some embodiments, the Hall sensor and the temperature sensor are thermally coupled by a thermal conductive paste.

In some embodiments, the controller may be a standalone component. In some embodiments, the controller may be integrated as a sub-component into another electronic component.

In some embodiments, the temperature sensor may be not located in proximity of the Hall sensor, but at a position that resembles the T environment in close proximity of the Hall sensor.

In various embodiments there may be provided a mobile device comprising a system as above or below.

In some embodiments, the mobile device may be a smartphone.

BRIEF DESCRIPTION OF THE DRAWINGS

Non-limiting examples of embodiments disclosed herein are described below with reference to figures attached hereto that are listed following this paragraph. Identical structures, elements or parts that appear in more than one figure are generally labeled with a same numeral in all the figures in which they appear. The drawings and descriptions are meant to illuminate and clarify embodiments.

DETAILED DESCRIPTION

Camera actuator controllers have analog circuitry for connection to a Hall sensor. As indicated above, a Hall sensor channel comprises an input voltage sense and output constant current source. Some camera actuator controllers have spare channels for more Hall sensors, which are not in use ("unused channels").

Figure 1:
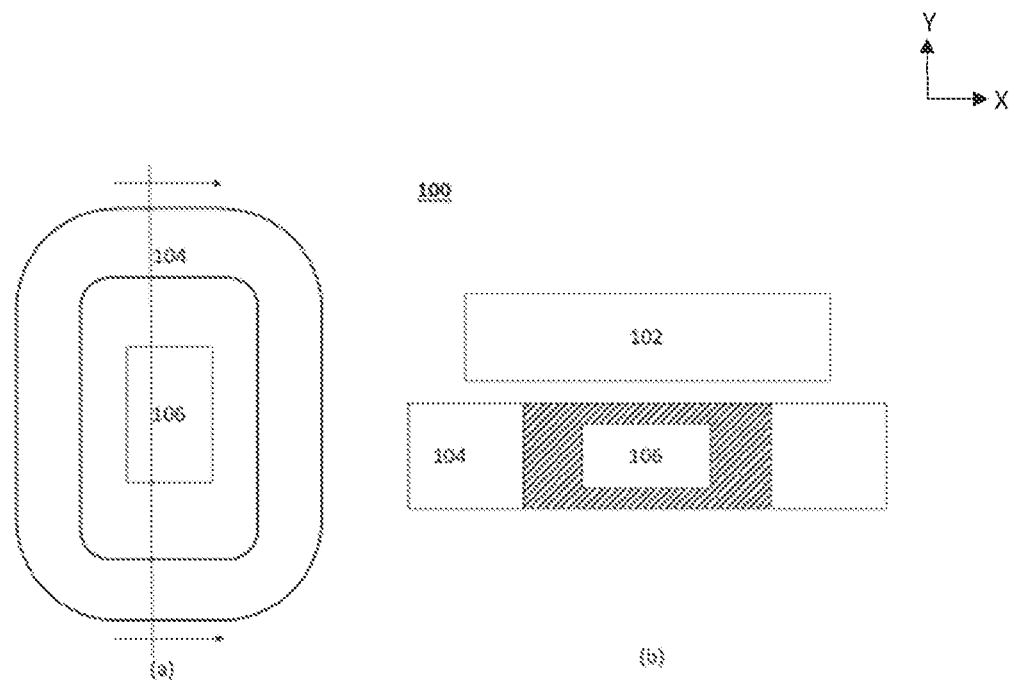
FIG. 1 shows schematically an exemplary VCM in (a) top view and (b) cross section.
Figure 2:
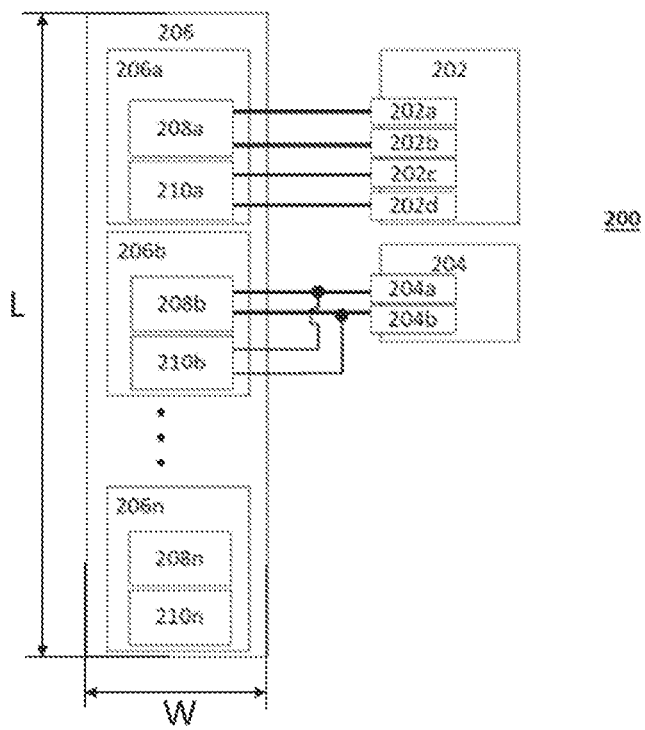
FIG. 2 illustrates an embodiment of a system disclosed herein and comprising a Hall sensor, a temperature sensor and a controller.

Reference is now made to FIG. 2, which illustrates an embodiment of a system 200 comprising a Hall sensor 202, a temperature sensor 204 ("T-sensor") and a controller (also called "microcontroller" or "MCU") 206. Controller 206 is for example a VCM controller or a Hall sensor controller used in digital cameras. Controller 206 includes a plurality of sensor channels 206a, 206b . . . 206n. Each sensor channel 206a, 206b . . . 206n includes a respective current module 208a, 208b . . . 208n and a respective voltage sense module 210a, 210b . . . 210n. Applicant has determined that controller 206 may be coupled to T-sensor 204. Hall sensor 202 includes input terminals 202a and 202b, which are current input terminals, and output terminals 202c and 202d, which are voltage output terminals. T-sensor 204 comprises two terminals 204a and 204b, which are current terminals. Current module 208a is coupled to input terminals 202a and 202b and is configured to excite a constant current through input terminals 202a and 202b. Voltage sense module 210a is coupled to output terminals 202c and 202d and is configured to measure the voltage over terminals 202c and 202d. Current module 208b is coupled to terminals 204a and 204b and is configured to excite a constant current through terminals 204a and 204b. In some embodiments, current module 208b may be coupled to terminals 204a and 204b via another electrical component such as a resistor. Voltage sense module 210b is also coupled to terminals 204a and 204b and is configured to sense the voltage over terminals 204a and 204b.

A controller as defined herein may be a standalone component, e.g. an integrated circuit (IC). An IC with a built-in Hall signal processing circuit may be beneficial. Typically and in a top view, such a standalone controller has a substantially quadrangular shape, with its length ("L") and width ("W") being substantially larger than its height. Typically, a length×width may be (1-5) mm×(1-5) mm and a height may be (0.3-1) mm, e.g. 4 mm×4 mm×0.75 mm (having an "area" of 16 mm$^2$) or 2 mm×5 mm×0.5 mm (having an area of 10 mm$^2$).

In other embodiments, a controller may be included as a sub-component in another electronic component. The other electronic component may be a controller not only including the channels having a current module and a voltage sense module each, such as channels 206a, . . . 206n, and built-in Hall signal processing circuits, but it may have additional channels with other functionalities. In some embodiments, the other controller may be realized in the application processor (AP) of a mobile electronic device. In other embodiments, the other controller may be realized in the image sensor of a camera included in a mobile electronic device.

Figure 3:
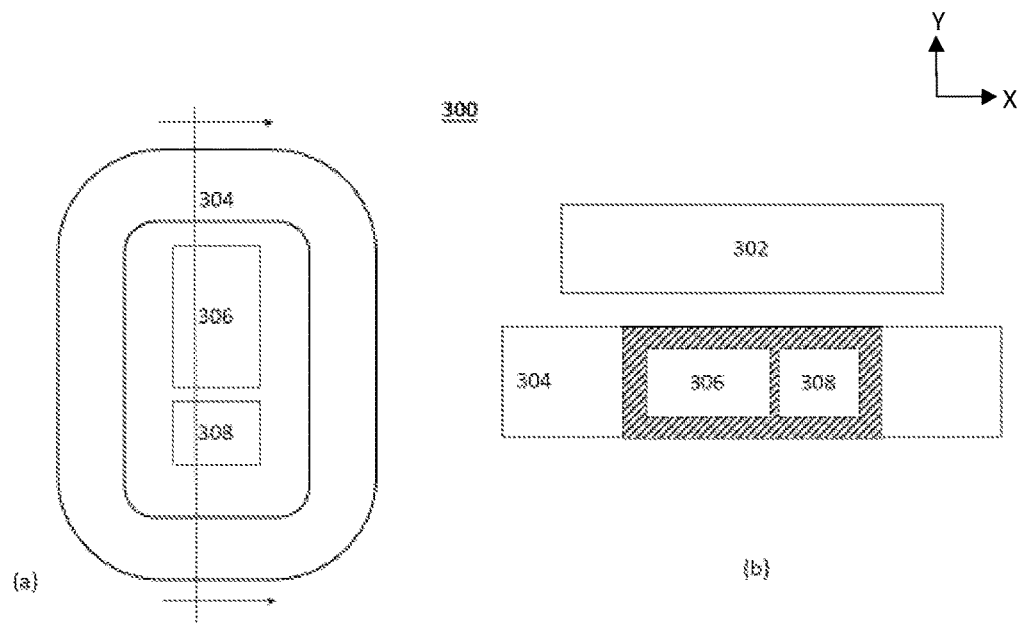
FIG. 3 illustrates schematically an embodiment of a VCM with T-compensation for Hall sensor sensing drift disclosed herein in (a) top view and (b) cross section.

Reference is now made to FIG. 3, which illustrates an embodiment of a VCM with T-compensation for Hall sensor sensing drift disclosed herein and numbered 300. FIG. 3 illustrates in (a) a top (planar) view and in (b) a side (cross section) view of the VCM. VCM 300 includes a magnet 302 and a coil 304. In some embodiments and as shown, a Hall sensor 306 and a T-sensor (e.g. a semiconductor diode serving as a T-sensor) 308 are positioned inside coil 304. In other embodiments, Hall sensor 306 and T-sensor 308 may be positioned outside of a coil such as coil 304. In some embodiments, T-sensor 308 is located in close proximity to Hall sensor 306. In some embodiments, T-sensor 308 may be a thermistor. In other embodiments, T-sensor 308 may be included in a system based on another actuator technology, e.g. a system including a stepper motor.

In some embodiments, it may be beneficial to place the T-sensor as close to the Hall sensor as possible. "As close as possible" may be 1 mm, or even 500 µm or less, e.g. 100 µm.

In other embodiments, especially where a temperature gradient is relatively shallow, the distance between the T-sensor and the Hall sensor may be larger.

In yet other embodiments, a T-sensor may be placed not in close proximity of the Hall bar, but at a location that resembles the T environment which is present in close proximity of the Hall sensor. As an example, assume that one may find that the local T at the Hall sensor location correlates very strongly with a local T at a different position, which may not necessarily be close according to the definition given above.

As an example for such a constellation and with reference to FIG. 3, a Hall sensor may be placed at a position left (in the −x direction) of coil 304, and a T-sensor may be placed at a position right (in the +x direction) of coil 304, so that the center of the Hall sensor and the center of the T-sensor are both located at an identical y-coordinate and that additionally the distance between the Hall sensor and the coil is substantially identical to the distance between the T-sensor and the coil.

In other embodiments, Hall sensor 306 and T-sensor 308 may be thermally coupled. A thermal coupling may be beneficial as it allows sensing the local T at the position of the Hall bar more accurately. A thermal coupling may be achieved by physically coupling Hall sensor 306 and T-sensor 308, e.g. with thermal conductive paste or with some other component exhibiting high thermal conductivity and which physically connects the Hall sensor and the T-sensor.

In some embodiments and e.g. for a more precise measurement of a local T, two or more T-sensors may be included at two or more different positions and coupled to a controller for sensing a temperature at the two or more positions. For estimating a local T, e.g. at the position of the Hall sensor, T values of the two or more T-sensors may be considered, e.g. by averaging the T values or by calculating a weighted sum considering for each T-sensor its T value as well as its distance from to the Hall sensor.

As known, the forward voltage of a diode is approximately proportional to the absolute T. The well-known expression for the (forward bias) diode voltage Vd is as follows:

$$Vd \approx kT/q \ \ln(Id/Is) \tag{1}$$

where Vd=voltage across diode, k=Boltzman contant, T=absolute T, q=electron charge, Id=current through diode and Is=diffusion current. Therefore, a measurement of the diode voltage Vd provides T.

Figure 4:
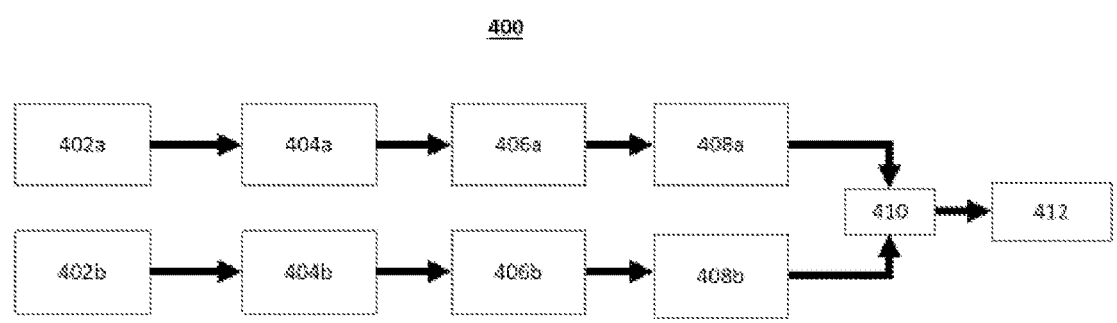
FIG. 4 illustrates an internal layout of the controller in the system of FIG. 2.

Reference is now made to FIG. 4, which illustrates an embodiment 400 using a controller such as controller 206 for performing a T compensated Hall sensor measurement. Specifically, it is outlined how a controller channel such as 206a, 206b . . . 206n may be used for extracting a T signal from a T-sensor such as 204 for T-compensated Hall sensor sensing.

In many VCMs such as 100, the controller includes a larger number of channels than coupled sensors. For example, referring to VCM 100, the controller may typically include 1-5 channels, and only one Hall sensor such as 106 may be coupled to the controller. For example, assuming a 3-channel controller, from the 3 channels of this controller only one channel is "used", wherein 2 channels are "unused". For embodiment 400, a T-sensor such as 204 can be coupled to one of the unused channels.

In other embodiments having two or more unused channels, two or more T-sensors may be coupled to the unused channels.

As shown in FIG. 2, a first T-sensor channel of controller 206 may be coupled to a Hall sensor such as 202, and a second sensor channel may be coupled to a T-sensor such as 204. Each sensor channel includes a current module and a voltage sense module. In the following, consider only the voltage sense modules of each channel, assuming however that the respective current modules excite a constant current output for the sensors.

The internal layout includes two voltage sense modules 402a and 402b, two amplifiers 404a and 404b, two analog-to-digital converters (ADC) 406a and 406b, two variables 408a and 408b, a function for transfer from hardware (HW) to software (SW) 410 and an output 412. As known, a variable is a storage address (identified by a memory address) paired with an associated symbolic name, which contains some known or unknown quantity of information referred to as a value. Voltage sense module 402a may be the same as voltage sense module 210a of FIG. 2 and is coupled electrically to amplifier 404a. Amplifier 404a is coupled electrically to ADC 406a, which outputs variable 408a. Voltage sense module 402b may be the same as voltage sense module 210b of FIG. 2 and is coupled electrically to amplifier 404b. Amplifier 404b is coupled electrically to ADC 406b, which outputs variable 408b. Variables 408a and 408b are inputs to function 410. Variable 408a may represent the voltage measured over the output of a Hall sensor ($V_H$), also referred to as "Hall output voltage signal". Variable 408b may represent the voltage over the output of a T-sensor that is translatable into a T value used in equation 2 below. Function 410 takes variable 408a and variable 408b and outputs output 412. In an example, the value of output 412 may be an estimation of the (sought after) value of $V_H0$, the factor of the voltage over the output of the Hall sensor that is affected only by magnetic flux and not by T, and a and b are constants. For example:

$$V_H(B,T) \approx V_H0(B) \times [1 + a \times (T-T0)] + b \times (T-T0) \tag{2}$$

$V_H$ is a function of B, the magnetic flux measured by the Hall sensor, and T, the T measured by a T-sensor. T0 is a reference temperature. The values of constant parameters a and b may be supplied by the manufacturer, calculated from the Hall sensor datasheet and/or calculated in a controlled environment experiment.

To summarize, in a method disclosed herein, one uses $V_H$ and T (which is related in a known way to Vd) to find $V_H0$.

Figure 5:
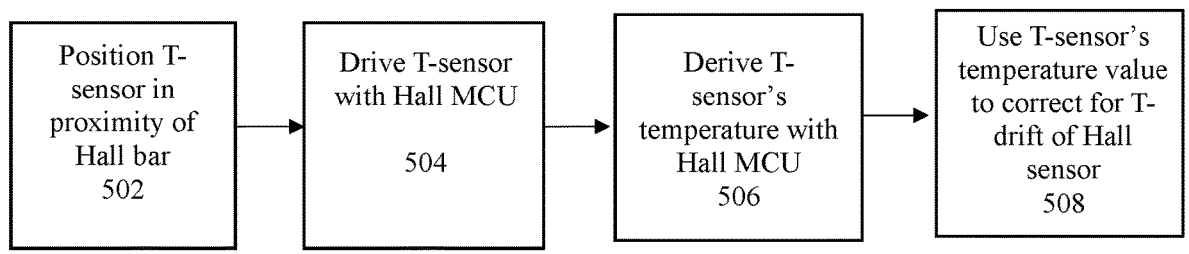
FIG. 5 illustrates in a flow chart an embodiment of a method disclosed herein.

FIG. 5 shows an embodiment of a method of use of system 200. T-sensor 308 is positioned in proximity to Hall sensor 306 as in FIG. 3 in step 502. The T-sensor is driven by MCU 206 in step 504, and its T sensing is obtained in step 506. The value of the T read in step 506 is used to correct for T-drift of the Hall sensor measurement in step 508.

For the sake of clarity the term "substantially" is used herein to imply the possibility of variations in values within an acceptable range. According to one example, the term "substantially" used herein should be interpreted to imply possible variation of up to 10% over or under any specified value. According to another example, the term "substantially" used herein should be interpreted to imply possible variation of up to 5% over or under any specified value. According to a further example, the term "substantially" used herein should be interpreted to imply possible variation of up to 2.5% over or under any specified value.

Unless otherwise stated, the use of the expression "and/or" between the last two members of a list of options for selection indicates that a selection of one or more of the listed options is appropriate and may be made.

It should be understood that where the claims or specification refer to "a" or "an" element, such reference is not to be construed as there being only one of that element.

While this disclosure has been described in terms of certain embodiments and generally associated methods, alterations and permutations of the embodiments and methods will be apparent to those skilled in the art. The disclosure is to be understood as not limited by the specific embodiments described herein, but only by the scope of the appended claims.

What is claimed is:

1. A camera actuator, comprising:
   a magnet-coil arrangement for providing a relative movement between a magnet and a coil to obtain a relative position;
   a Hall sensor located within the coil for sensing the relative movement;
   a temperature sensor located in proximity of the Hall sensor for providing temperature sensing; and
   a camera actuator controller coupled to the Hall sensor and having a plurality of sensor channels, each sensor channel comprising a voltage sense module and a current module, wherein the camera actuator controller and the temperature sensor are operationally coupled through an unused sensor channel, wherein the camera actuator controller is configured to control the relative movement by controlling a current flow through the coil, and to provide, based on the temperature sensing, a temperature correction input to the Hall sensor for compensating a temperature effect on the Hall sensor sensing, and wherein the voltage sense module and the current module in the unused sensor channel are electrically coupled together.

2. The camera actuator of claim 1, wherein the temperature sensor and the Hall sensor are located within the coil.

3. The camera actuator of claim 1, wherein the temperature sensor is a semiconductor diode.

4. The camera actuator of claim 1, wherein the temperature sensor is a thermistor.

5. The camera actuator of claim 1, wherein the magnet-coil arrangement is included in a voice coil-motor.

6. The camera actuator of claim 1, wherein the magnet-coil arrangement is included in a stepper motor.

7. The camera actuator of claim 1, including at least one additional temperature sensor to form a plurality of temperature sensors.

8. The camera actuator of claim 7, wherein the temperature correction is based on temperature sensing of at least two of the plurality of temperature sensors.

9. The camera actuator of claim 1, wherein the camera actuator controller has three channels.

10. The camera actuator of claim 1, wherein the camera actuator controller has four or more channels.

11. The camera actuator of claim 1, wherein the camera actuator controller has a built-in Hall signal processing circuit.

12. The camera actuator of claim 1, wherein the camera actuator controller has an area smaller than 25 mm$^2$.

13. The camera actuator of claim 1, wherein the camera actuator controller has an area smaller than 20 mm$^2$.

14. The camera actuator of claim 1, wherein the camera actuator controller has an area smaller than 15 mm$^2$.

15. The camera actuator of claim 1, wherein the Hall sensor and the temperature sensor are thermally-coupled.

16. The camera actuator of claim 1, wherein the camera actuator controller is a standalone component.

17. The camera actuator of claim 1, wherein the camera actuator controller is integrated into another electronic component.

18. A mobile device comprising the camera actuator of claim 1.

19. The mobile device of claim 18, wherein the mobile device is a smartphone.

* * * * *